United States Patent
Lopez et al.

(10) Patent No.: US 6,960,763 B2
(45) Date of Patent: Nov. 1, 2005

(54) ENERGY FILTER AND ELECTRON MICROSCOPE

(75) Inventors: G. Martinez Lopez, Madrid (ES); Katsushige Tsuno, Akishima (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/738,966

(22) Filed: Dec. 17, 2003

(65) Prior Publication Data

US 2004/0144920 A1 Jul. 29, 2004

(30) Foreign Application Priority Data

Dec. 17, 2002 (JP) .................................. 2002-364935

(51) Int. Cl.$^7$ .......................... H01J 49/44; H01J 47/00; H01J 40/00
(52) U.S. Cl. .................. 250/305; 250/310; 250/311; 250/281; 250/287; 250/293; 250/397; 250/398; 250/396 R
(58) Field of Search ................................. 250/281, 287, 250/293, 397, 398, 396 R, 305, 310, 311

(56) References Cited

U.S. PATENT DOCUMENTS

| | | | | |
|---|---|---|---|---|
| 5,126,565 A | * | 6/1992 | Rose | 250/305 |
| 5,838,011 A | * | 11/1998 | Krijn et al. | 250/396 R |
| 5,986,269 A | * | 11/1999 | Krijn et al. | 250/396 R |
| 6,067,164 A | * | 5/2000 | Onoguchi et al. | 356/401 |
| 6,407,384 B1 | * | 6/2002 | Tanaka et al. | 250/305 |
| 6,410,924 B1 | * | 6/2002 | Wang | 250/398 |
| 6,495,826 B2 | * | 12/2002 | Tsuno | 250/305 |
| 6,586,737 B2 | * | 7/2003 | Kaneyama | 250/311 |
| 6,720,558 B2 | * | 4/2004 | Kaneyama | 250/311 |
| 2001/0010358 A1 | * | 8/2001 | Kaneyama | 250/311 |
| 2002/0033449 A1 | * | 3/2002 | Nakasuji et al. | 250/306 |
| 2002/0153484 A1 | * | 10/2002 | Kaneyama | 250/311 |
| 2003/0030008 A1 | * | 2/2003 | Sobukawa et al. | 250/396 R |
| 2003/0226975 A1 | * | 12/2003 | Lopez et al. | 250/396 R |
| 2004/0144920 A1 | * | 7/2004 | Lopez et al. | 250/305 |
| 2004/0188607 A1 | * | 9/2004 | Ose et al. | 250/305 |

FOREIGN PATENT DOCUMENTS

| | | |
|---|---|---|
| JP | 3040245 | 10/1993 |
| JP | 2001-023558 | 1/2001 |

OTHER PUBLICATIONS

H. Rose, "The retarding Wien Filter as a high–performance imaging filter", *Optik 77*, No. 1 (1987), pp. 26–34.

* cited by examiner

*Primary Examiner*—John R. Lee
*Assistant Examiner*—Bernard E. Souw
(74) *Attorney, Agent, or Firm*—The Webb Law Firm (57) ABSTRACT

An energy filter with reduced aberration. The energy filter has a first stage of filter for receiving an electron beam entering along the optical axis and for focusing the beam in one direction vertical to the optical axis and a second stage of filter positioned along the optical axis behind the first stage of filter. The beam once focused by the first stage of filter is made to enter the second stage of filter. In the second stage of filter, the orbit of the electron beam is inverted with respect to the focal point. The two stages of filters are identical in length taken along the optical axis. The first and second stages of filters have electric and magnetic quadrupole fields, respectively, along the optical axis. These quadrupole fields make an angle of 45 degrees to the optical axis to achieve astigmatic focusing.

10 Claims, 10 Drawing Sheets

FIG.11

ENERGY FILTER AND ELECTRON MICROSCOPE

BACKGROUND OF THE INVENTION

1. Field of the Invention

The present invention relates to an energy filter for selectively passing charged particles having certain energies and to an electron microscope using this filter.

2. Description of Related Art

In recent years, a transmission electron microscope has been developed which has an energy filter positioned within the electron optical system for magnifying and projecting an electron beam transmitted through a specimen onto a fluorescent screen. With this transmission electron microscope fitted with such an energy filter, an electron microscope image of a specimen can be formed based on charged particles having only certain energies.

In this electron microscope fitted with such an energy filter, the energy width of the electron beam directed at the specimen must be narrowed in order to enhance the energy resolution. For example, in an electron microscope using an accelerating voltage of hundreds of kilovolts, the energy width is preferably on the order of 0.1 eV. The electron beam passed through the energy filter in this way is required to be achromatic, i.e., free of energy dispersion.

Therefore, a method consisting of placing an energy filter in a position where an electron beam is not yet accelerated and assumes a low energy state, performing energy selection, and then accelerating the beam to give high energy to it has been developed. The energy filter that provides energy selection in this way is known as a monochromator.

Where an electron beam with low energy passes through an energy filter, the influences of the Boersch effect must be taken into account. The Boersch effect is a phenomenon in which the energies of electrons (generally, charged particles) traveling close to each other affect each other according to their respective speeds due to their mutual Coulomb interactions. Accordingly, where an electron beam of low energy passes through the energy filter, especially when electrons travel close to each other around the focal point within the filter, the electrons affect each other, varying their energies. This broadens their energies. Consequently, it is difficult to obtain an electron beam having a narrow energy width.

The sole method conventionally adopted such that the energy filter placed in a position where the electron beam is not yet accelerated is free from the Boersch effect is to prevent crossover of beam electrons by astigmatic focusing.

Figure 8A:
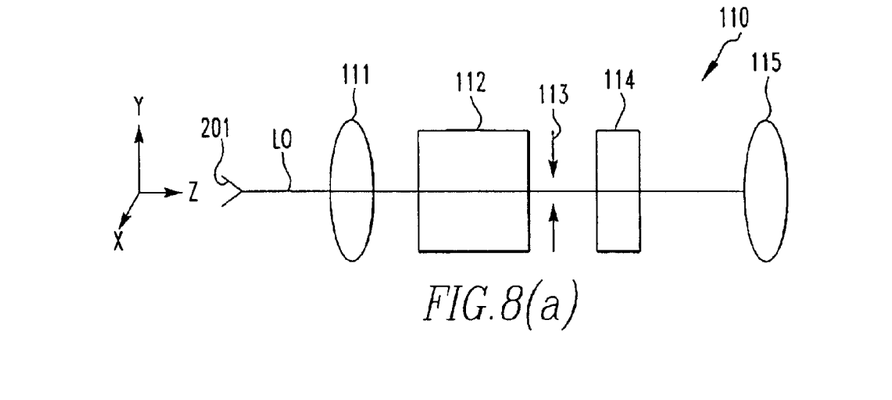
FIGS. 8(a)–8(d) are diagrams showing the configuration of a first energy filter.

FIGS. 8(a)–8(d) show the structure of a first energy filter that forms an astigmatic image. This and other figures are not drawn to scale, for convenience of illustration of the first energy filter 110. As shown in FIG. 8(a), the first energy filter 110 has two stages of Wien filters 112 and 114 that extend in the direction of the optical axis L0, or the Z-direction. The filters 112 and 114 are located before and after the position of a slit 113 asymmetrically with respect to this position (see Patent Reference 1 (Japanese Patent Laid-Open No. 2001-23558), for example). In particular, the first energy filter 110 has a first electrostatic lens 111, the first stage of Wien filter 112, the slit 113, the second stage of Wien filter 114, and a second electrostatic lens 115 in this order as viewed along the direction of the electron beam that is emitted from an electron gun 201 and travels in the Z-direction.

Figure 8B:
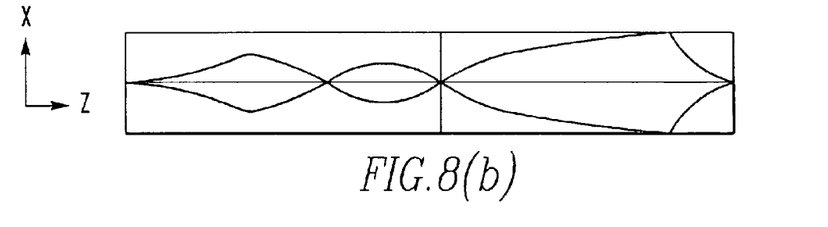
Figure 8C:
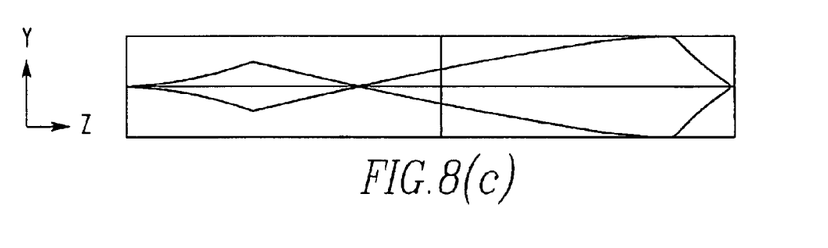
Figure 8D:
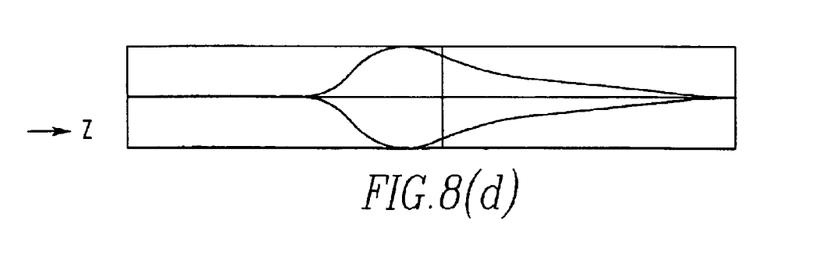

In the first energy filter 110, the electron beam takes an orbit (FIG. 8(b)) along the X-axis that is the dispersive direction, an orbit (FIG. 8(c)) extending in the Y-direction perpendicularly to that orbit, and a dispersive orbit (FIG. 8(d)). As can be seen from these orbits, the X-direction electron beam is focused at the position of the slit 113 but the Y-direction beam is not.

Figure 9:
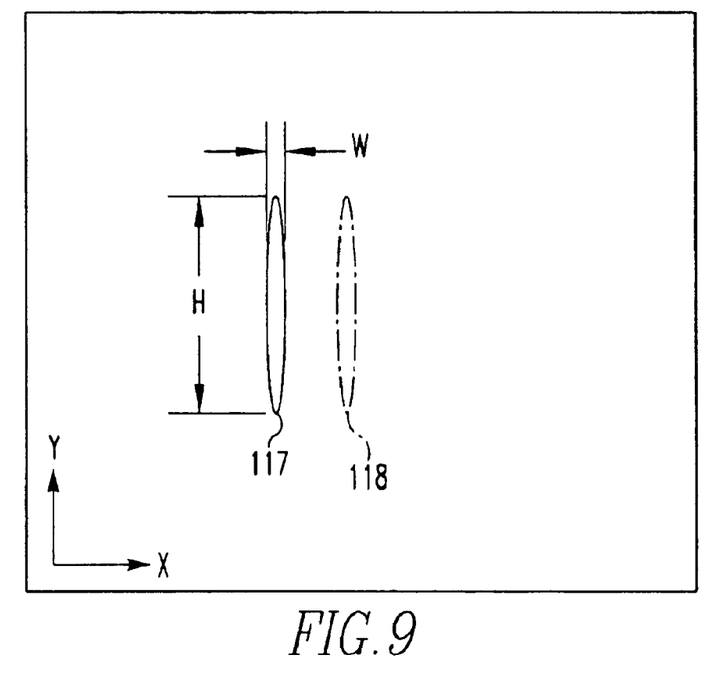
FIG. 9 shows the profile portions of an electron beam focused on a slit in the first energy filter.

FIG. 9 shows the profile portions of the electron beam focused on the slit 113 of the first energy filter. The beam focused on the slit 113 assumes an elliptical form extending in the Y-direction. Because the first energy filter 110 has a dispersive direction in the X-direction, beam electrons having different energies are focused at different positions in the X-direction. The profile portions 117 and 118 of the beam electrons having different energies and focused at different positions in the X-direction are shown in the figure.

In the first energy filter 110, the position at which the electron beam is focused can be adjusted in the Y-direction. Therefore, the ratio between the width W and height H of the profile of the electron beam on the slit 113 can be adjusted.

However, in the first energy filter 110, acceleration performed behind the second stage of Wien filter 114 makes it impossible to eliminate the effects of aberrations created by the first and second stages of Wien filters 112 and 114 at the focal point of the electron beam behind the accelerating electrode. The final profile of the electron beam contains aberration.

Figure 10A:
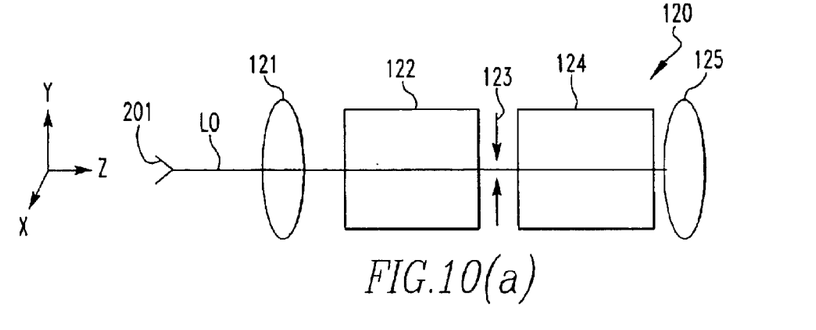
FIGS. 10(a) to 10(d) are diagrams showing the configuration of a second energy filter.

FIGS. 10(a) to 10(b) show the structure of a second energy filter. As shown in FIG. 10(a), the second energy filter, indicated by 120, has two stages of Wien filters 122 and 124 that extend in the direction of the optical axis L0, or the Z-direction. The filters 122 and 124 are located before and after the position of a slit 123 symmetrically with respect to this position. In particular, the second energy filter 120 has a first electrostatic lens 121, the first stage of Wien filter 122, the slit 123, the second stage of Wien filter 124, and a second electrostatic lens 125 in this order as viewed along the direction of the electron beam that is emitted from an electron gun 201 and travels in the Z-direction. The filters 122 and 124 are symmetrical in shape with respect to the slit 123.

Figure 10B:
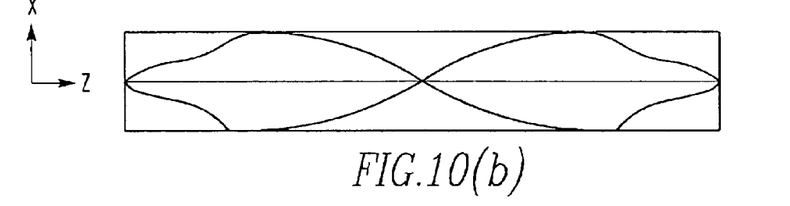
Figure 10C:
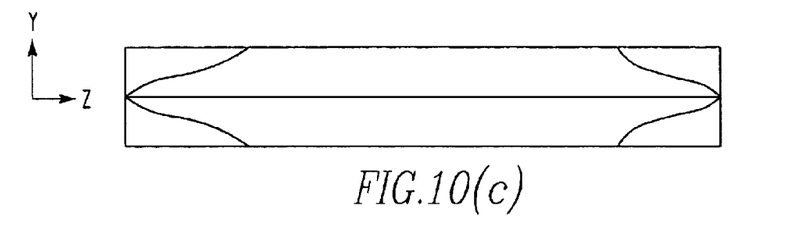
Figure 10D:
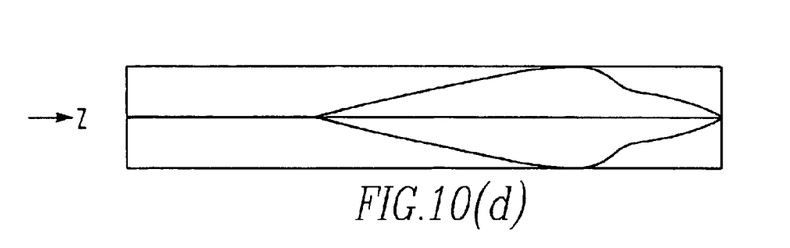

In the second energy filter 120, the electron beam takes an orbit (FIG. 10(b)) in the X-direction that is the dispersive direction and an orbit (FIG. 10(c)) extending in the Y-direction perpendicularly to that orbit. As can be seen from these orbits, the orbits of the electron beam through the Wien filters 122 and 124 are symmetrical with respect to the position of the slit 123. Specifically, the orbit of the beam is inverted with respect to the focal position on the slit 123. Where the orbit has such symmetry, the aberrations in the first and second stages of Wien filters 122 and 124 cancel each other at the focal point of the electron beam behind the second stage of Wien filter 124, resulting in a beam with reduced aberration. FIG. 10(d) shows the dispersive orbit of the electron beam.

Also, in the second energy filter 120, the profile of the electron beam on the slit 123 is such that the height is greater than the width in the same way as in the case of the first energy filter 110. In the configuration of this second energy filter 120, however, the ratio of the width to the height of the profile of the electron beam on the slit 123 is determined only by the incident angle of the electron beam. To prevent this ratio from becoming excessive, a well-collimated beam must be entered through a small aperture.

Where the profile of the electron beam is elongated in the Y-direction by focusing the beam on the slit in the X-direction (along the width) by the aforementioned astigmatic focusing and unfocusing the beam in the Y-direction (along the height), the ratio of the width to the height becomes excessively large. Consequently, when energy selection is performed on the slit, the electron beam will produce greater loss or the energy width will not be reduced as expected.

The purpose of elongating the profile of the electron beam is to reduce Coulomb interactions, such as the Boersch effect. Therefore, the profile of the beam is not elongated too much. It is necessary to set the ratio to 1:2 or higher. However, a large ratio, such as 1:10, is not necessary. The ratio may be set to intermediate values between them.

In the case of an energy filter having Wien filters that are located ahead of and behind the slit 113 asymmetrically with respect to this slit as in the first energy filter 110 already described in connection with FIGS. 8(a)–8(d), the profile of the electron beam at the slit 113 can be set to a value within the range described above. However, the first energy filter 110 cannot cancel aberrations by the first and second stages of Wien filters 112 and 114 as mentioned previously. In consequence, the electron beam going out of the first energy filter 110 contains aberration.

Of course, the aberration in the energy filter can be reduced by well designing the first stage of filter, as well as by canceling out the aberrations in the first and second stages of Wien filters 122 and 124 that are symmetrical with respect to the slit 123 as shown in the second energy filter 120.

Figure 11:
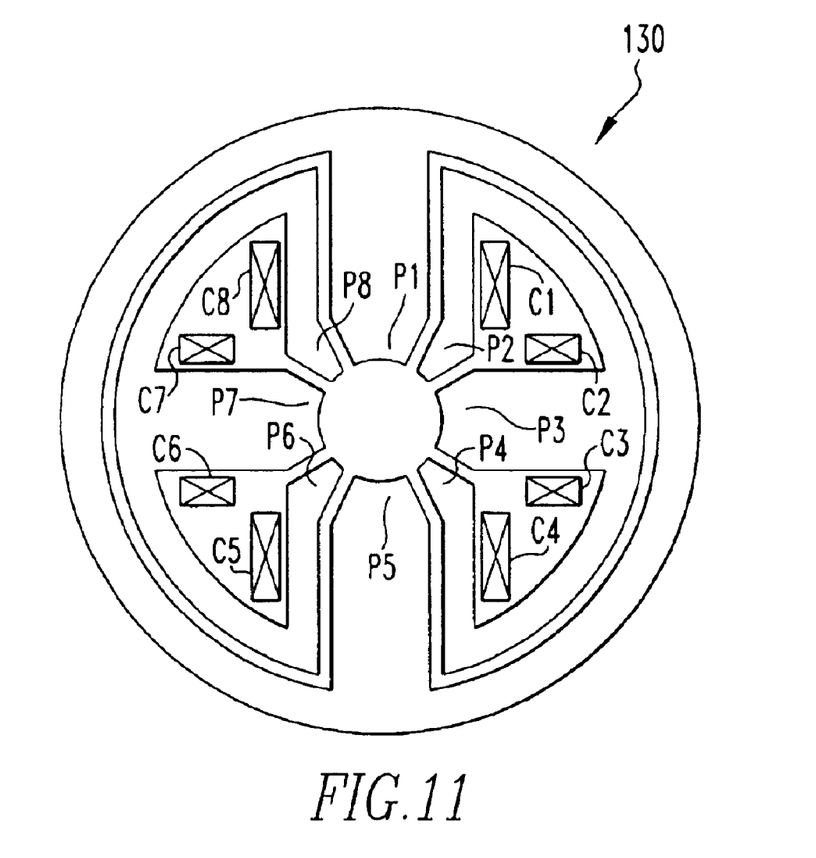
FIG. 11 is a diagram showing a Wien filter with small aberration.

FIG. 11 shows a Wien filter with small aberration. This Wien filter, indicated by 130, is designed to reduce the aberration by bringing the electric field distribution in the fringing field into coincidence with the magnetic field distribution. This in turn is achieved by producing electric and magnetic fields using eight poles P1 to P8 (see, for example, Patent Reference 2 (Japanese Patent No. 3,040,245)). Also shown in the figure are coils C1 to C8. Aberration still remains, however, even if this Wien filter having the eight poles is used. Hence, there is a demand for a technique of reducing this aberration.

SUMMARY OF THE INVENTION

The present invention is proposed in view of the foregoing circumstances. It is an object of the present invention to provide an energy filter with smaller aberration and an electron microscope fitted with this energy filter.

To achieve this object, the present invention provides an energy filter having a first filter and a second filter disposed behind the first filter, the first filter using a combination of electric and magnetic fields to select charged particles having a certain energy. The first filter is so controlled that a beam of charged particles having a cross-sectional shape extending in a direction perpendicular to a direction in which the charged particles are dispersed in the first filter is formed between the first and second filters. The second filter is so controlled that astigmatic aberration created by the first filter is reduced.

Other objects and features of the invention will appear in the course of the description thereof, which follows.

DESCRIPTION OF THE PREFERRED EMBODIMENTS

Energy filters and electron microscopes according to embodiments of the present invention are hereinafter described in detail with reference to the drawings.

Figure 1:
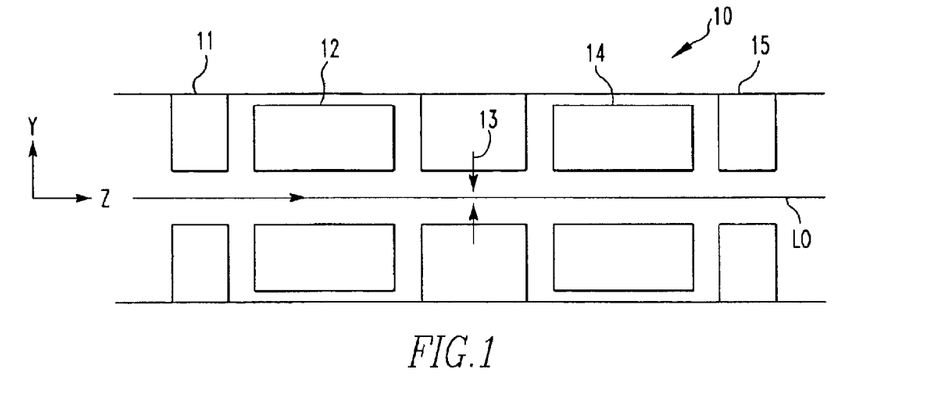
FIG. 1 is a diagram showing the configuration of an energy filter according to one embodiment of the present invention.

FIG. 1 shows the structure of an energy filter according to an embodiment. The energy filter, indicated by numeral 10, has a first stage of Wien filter 12, a slit 13, and a second stage of Wien filter 14 which are located in this order in the direction of travel of an electron beam along an optical axis L0. The electron beam is emitted from an electron gun (source of charged particles) and enters the first stage of Wien filter 12, which acts to focus the beam in one direction perpendicular to the optical axis L0. The Wien filters 12 and 14 are identical in shape. The slit 13 is located in the position where the beam is focused. The beam focused at the position of the slit 13 by the first stage of Wien filter 12 is made to enter the second stage of Wien filter 14. The second stage of Wien filter 14 is so designed that the orbit for the electron beam is inverted with respect to the focal position at the slit 13. The length of the second stage of Wien filter 14 as measured along the optical axis L0 is identical with that of the first stage of Wien filter 12.

A first clamp 11 is disposed ahead of the first stage of Wien filter 12. A second clamp 15 is positioned behind the second stage of Wien filter 14.

Each of the Wien filters 12 and 14 has electric and magnetic quadrupole fields along the optical axis L0, the fields being rotated through 45 degrees about the optical axis L0. Thus, stigmatic focusing is achieved.

Aberration is intentionally created on the first focus by the use of these electric and magnetic quadrupole fields, thus increasing the height H of the profile of the beam focused on the slit 13. In consequence, the Boersch effect due to crossover of the beam electrons is suppressed.

In the energy filter 10, the first stage of Wien filter 12 and the second stage of Wien filter 14 which are identical in shape are disposed along the optical axis L0 symmetrically with respect to the slit 13. The orbit of the beam is inverted with respect to the focal position on the slit 13. Accordingly, aberrations due to the Wien filters 12 and 14 are canceled out. Consequently, aberration at the focal point of the electron beam behind the energy filter 10 substantially disappears. Furthermore, stigmatic focusing is accomplished.

Figure 2:
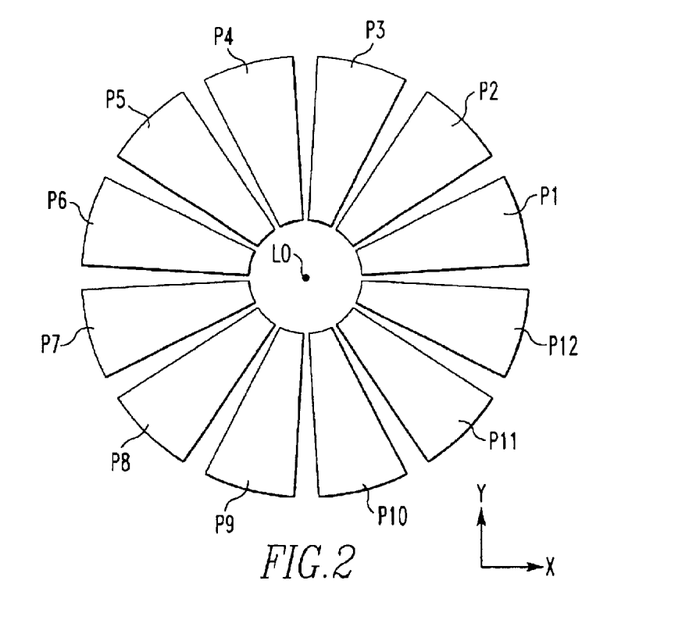
FIG. 2 is a diagram showing the configuration of the first stage of Wien filter.

FIG. 2 shows the structure of the first stage of Wien filter 12. The second stage of Wien filter 14 is similar in structure to the filter 12 and so its description is omitted.

For the convenience of illustration, the XYZ coordinate axes are so set that the direction of the optical axis L0 along which the electron beam moves is taken as the Z-direction.

The first stage of Wien filter 12 has first through twelfth polepieces P1 to P12 showing twelve-fold symmetry with respect to the optical axis L0. The polepieces P1 to P12 are made of a magnetic material. Voltages are applied to these polepieces. A coil is wound around each of at least four of these polepieces. The polepieces P1 to P12 are set in this order in a counterclockwise direction, for example, about the Z-axis from the X-direction.

In the present embodiment, voltages as given by Eq. (1) are applied to the polepieces P1 to P12 to produce an electric quadrupole field. Let V2(i) be the voltage applied to the ith magnet polepiece relative to the voltage V2(1) at the first magnet polepiece P1.

$$V2(2)=2\times V2(1), V2(3)=V2(1), V2(4)=-V2(1), V2(5)=-2\times V2(1),$$
$$V2(6)=-V2(1), V2(7)=V2(1),$$

$$V2(8)=2\times V2(1), V2(9)=V2(1), V2(10)=-V2(1), V2(11)=-2\times V2(1),$$
$$V2(12)=-V2(1) \quad (1)$$

Furthermore, in the present embodiment, an ampere-turn (the product of the current and the number of coil turns) given by Eq. (2) is imparted to each of the polepieces P1 to P12 to produce the magnetic quadrupole field. It is assumed here that the ampere-turn of the ith polepiece Pi is given by NI2(i). These ampere-turns NI2(i) are given based on the ampere-turn NI2(1) of the first polepiece P1.

$$NI2(2)=0, NI2(3)=-NI2(1), NI2(4)=-NI2(1), NI2(5)=0, NI2(6)=NI2(1),$$

$$NI2(7)=NI2(1), NI2(8)=0, NI2(9)=-NI2(1), NI2(10)=-NI2(1),$$
$$NI2(11)=0, NI2(12)=NI2(1) \quad (2)$$

Figure 3A:
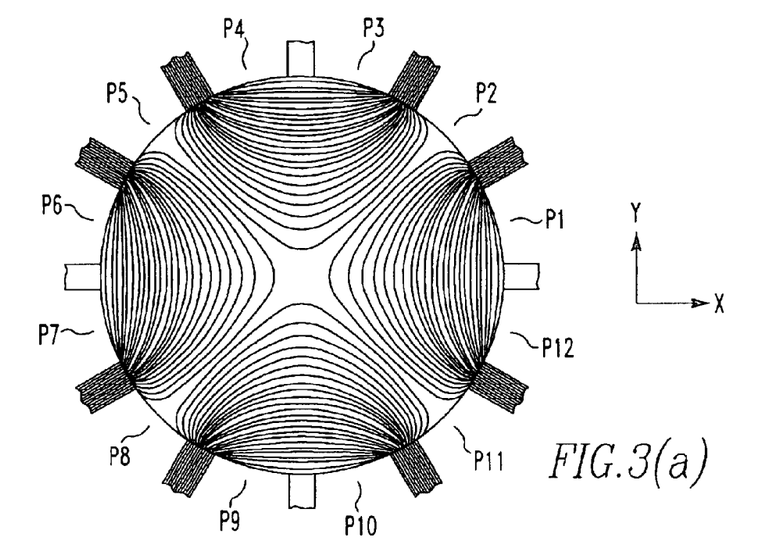
FIGS. 3(a) and 3(b) are diagrams showing the potential distributions in electric and magnetic quadrupole fields in the first stage of Wien filter.
Figure 3B:
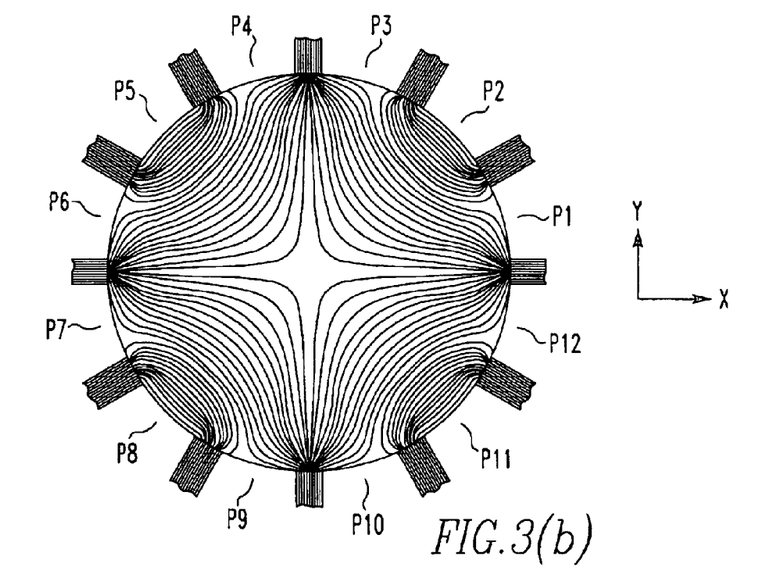

FIGS. 3(a) and 3(b) depict diagrams showing the potential distributions in the electric and magnetic quadrupole fields in the first stage of Wien filter 12. FIG. 3(a) shows the distribution in the electric quadrupole field, and FIG. 3(b) shows the distribution in the magnetic quadrupole field. In these diagrams, curves indicating equipotential lines are shown.

In the present embodiment, with respect to the electric quadrupole field, the twelfth polepiece P12 and the first polepiece P1 which are opposite to each other with respect to the X axis have the same polarity. Similarly, the sixth polepiece P6 and seventh polepiece P7 are placed opposite to each other with respect to the X axis and have the same polarity. The third polepiece P3 and fourth polepiece P4 which are opposite to each other with respect to the Y axis have the same polarity. Similarly, the ninth polepiece P9 and tenth polepiece P10 are placed opposite to each other with respect to the Y axis and have the same polarity.

With respect to the magnetic quadrupole field, a distribution equivalent to a distribution obtained by rotating the distribution in the electric quadrupole field through 45 degrees is produced. That is, the first through third polepieces P1 to P3 are identical in polarity with the seventh through ninth polepieces P7 to P9, respectively. The fourth through sixth polepieces P4 to P6 are identical in polarity with the tenth to twelfth polepieces P10 to P12, respectively.

In the present embodiment, the first and second stages of Wien filters 12 and 14 satisfy the Wien condition by electric and magnetic dipole fields. In addition, aberration is intentionally created on the first focus by the electric and magnetic quandrupole fields.

Let E1 and B1 be the electric and magnetic dipole fields, respectively. Let v be the velocity of electrons. The Wien condition is given by $$E1=v\ B1 \quad (3)$$

Let E2 and B2 be the electric and magnetic quadrupole fields, respectively. Let R be the cyclotron radius. The stigmatic focusing condition is given by $$f(E2)+g(B2)=1 \quad (4)$$

where $f(E2)=-4R\ E2/E1$ and $g(B2)=4R\ B2/B1$.

Furthermore, in the present embodiment, the electric and magnetic quadrupole fields are set to ranges given by Eqs. (5) and (6), respectively.

$$1<f(E2)<4 \quad (5)$$

$$-3<g(B2)<0 \quad (6)$$

Figure 4A:
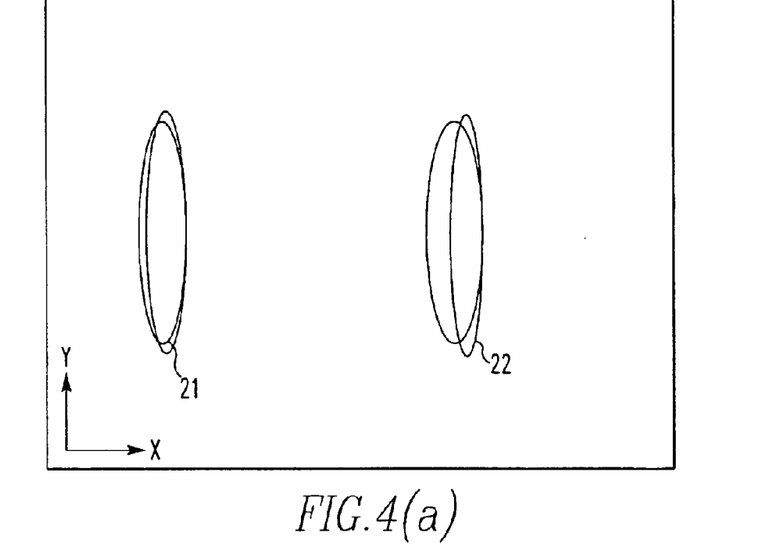
FIGS. 4(a) and 4(b) show the profile portions of the electron beam focused on a slit in this embodiment.
Figure 4B:
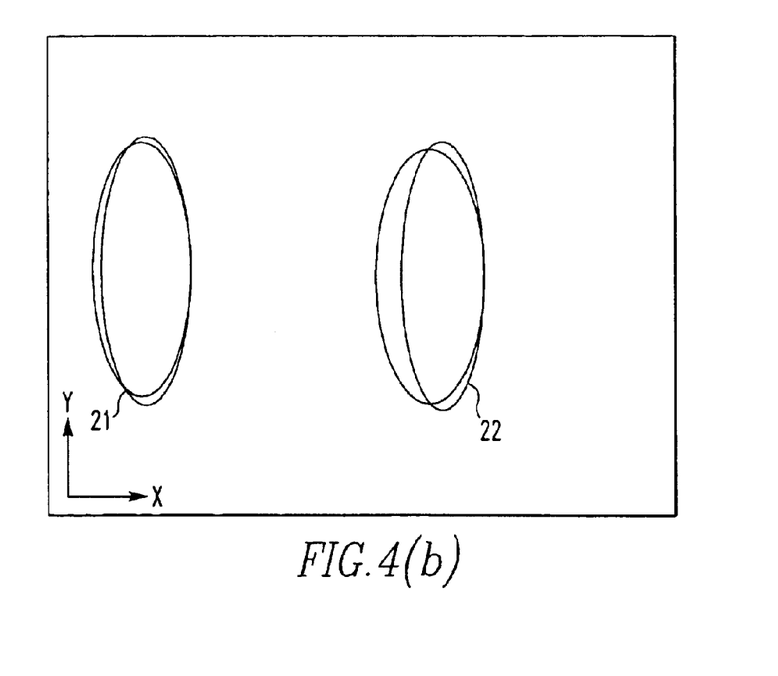

FIGS. 4(a) and 4(b) are diagrams showing examples of the profile of the electron beam focused on the slit 13 in the present embodiment. FIG. 4(a) shows a first specific example in which f(E2)=2.0 and g(B2)=-1.0, and FIG. 4(b) shows a second specific example in which f1(E2)=2.2 and f2(B2)=-1.2

These are obtained in a case where electrons are made to enter the energy filter 10 according to the present embodiment with a half-value angle of 0.2 degree and an accelerating voltage of 1 kV. In each figure, the left profile portion 21 is obtained by focusing of an energy-loss electron beam. The right profile portion 22 is obtained by focusing of an electron beam having an energy loss of 0.4 eV. The same principles apply to FIGS. 5(a) and 5(b) and FIG. 6 that will be referenced later.

In both first and second specific examples, the electron beam is shaped into substantially elliptical profile portions 21 and 22, elongated in the Y-direction. These elliptical profile portions 21 and 22 are produced by aberration created by electric and magnetic quadrupole fields.

In each example, the profile portions 21 and 22 of the beam are sufficiently spaced from each other. Accordingly, the energy filter 10 according to the present embodiment achieves an energy resolution of less than 0.4 eV. Where estimated from the figure, the energy resolution is less than 0.1 eV.

In this way, in the present embodiment, the conditions given by Eqs. (5) and (6) are added to the stigmatic focusing condition of Eq. (4). As described later, the conditions of Eqs. (5) and (6) induce aberration in the electron beam focused onto the slit 13, producing the profile portions 21 and 22 stretched in the Y-direction.

Since the direction of dispersion is the X-direction, the profile portions 21 and 22 stretched in the Y-direction assure high resolution.

Figure 5A:
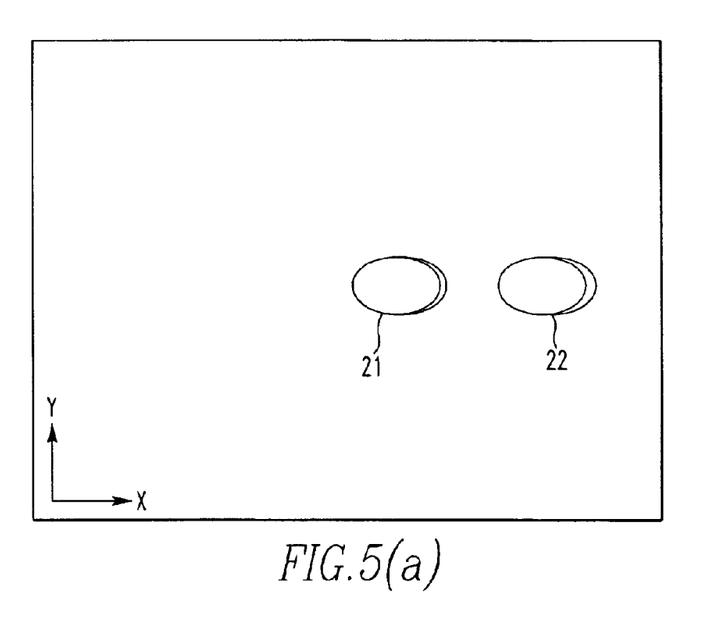
FIGS. 5(a) and 5(b) show the profile portions of the electron beam focused on the slit in a case where the conditions of Eqs. (5) and (6) are not satisfied.
Figure 5B:
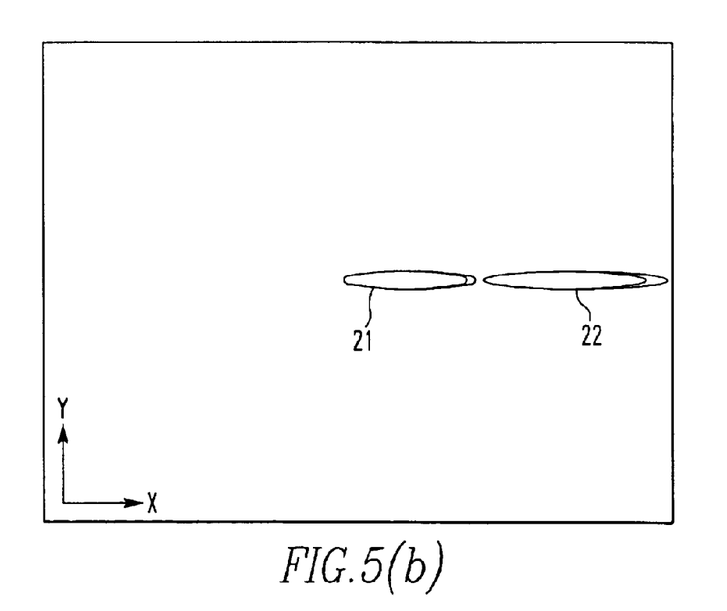

The meaning of the conditions given by Eqs. (4), (5), and (6) is now described. FIGS. 5(a) and 5(b) are diagrams showing the profile portions of an electron beam focused onto the slit 13, as a reference example, in a case where the condition of Eq. (4) is satisfied but the conditions of Eqs. (5) and (6) are not. FIG. 5(a) shows a case in which only an electric quandrupole field is produced to satisfy the stigmatic focusing condition of Eq. (4). The method of achieving the stigmatic focusing condition of Eq. (4) using only the electric quadrupole field is implemented in an octopole Wien filter.

In this case, the profile portions 21 and 22 of the electron beam focused on the slit 13 assume elliptical forms stretched in the X-direction, i.e., in the direction of dispersion. Where estimated from the figure, the energy resolution is less than the energy difference of 0.4 eV but does not reach 0.2 eV.

FIG. 5(b) shows a case in which stigmatic focusing condition of Eq. (4) is achieved only by the quadrupole magnetic field B2. The method of achieving the stigmatic focusing condition of Eq. (4) only by a magnetic quadrupole field in this way is implemented by a Wien filter having tilted polepieces.

In this case, the profile portions 21 and 22 of the electron beam focused on the slit 13 are stretched in the X-direction, i.e., in the direction of dispersion. Since the profile portions 21 and 22 overlap, the energy resolution is lower than 0.4 eV.

In the energy filter 10 according to the present embodiment, the amount of dispersion along the X-direction is almost constant irrespective of the values of the electric and magnetic quadrupole fields. Accordingly, the profile portions 21 and 22 of the electron beam on the slit 13 contribute much to the energy resolution.

In particular, in the aforementioned first and second specific examples, the profile portions 21 and 22 of the electron beam focused on the slit 13 are stretched in the X-direction. It can be seen, therefore, that the profile portions 21 and 22 may be stretched in the Y-direction in order to improve the energy resolution.

As an example, an aberration-correcting condition proposed by Rose (H. Rose, "The retarding Wien filter as a high-performance imaging filter," *Optik* 77, (1987), pp. 26–34), as given by Eq. (7) is applied.

$$f(E2)=4 \text{ and } g(B2)=-3 \tag{7}$$

Figure 6:
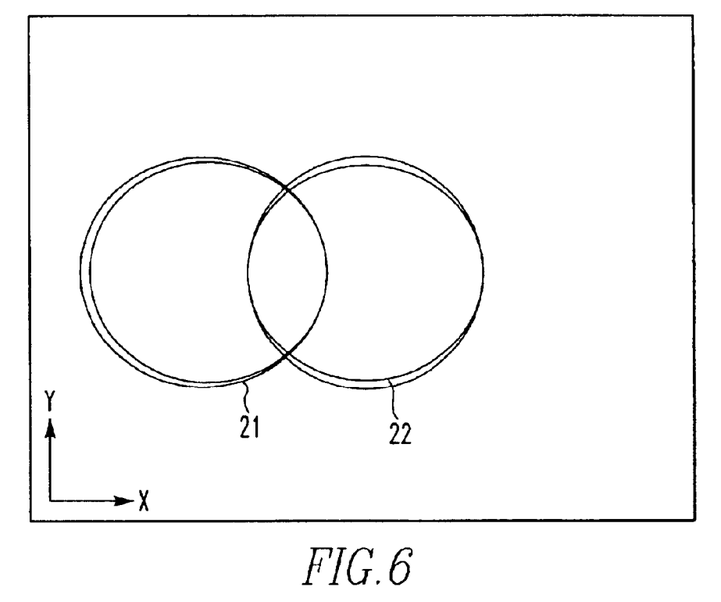
FIG. 6 shows the profile portions of an electron beam focused on a slit under the Rose's condition.

FIG. 6 shows the profile portions of an electron beam focused on the slit 13 under the Rose's condition of Eq. (7) as a reference example.

Comparison with the reference example shown in FIGS. 5(a) and 5(b) reveal that the profile portions 21 and 22 of the electron beam focused onto the slit 13 are stretched in the Y-direction and approximate a circle. However, the profile portions increase in size and overlap with each other. Consequently, the energy resolution is greater than 0.4 eV.

In the present embodiment, the conditions of Eqs. (5) and (6) above are imposed to stretch the profile portions 21 and 22 of the electron beam further in the Y-direction in the reference examples of FIGS. 5(a) and 5(b) and 6.

To satisfy the conditions of Eqs. (5) and (6), the relations f(E2)=2.0 and g(B2)=−1.0 are introduced in the first specific example described above. Also, in the second specific example, the relations f(E2)=2.2 and g(B2)=−1.2 are introduced. That is, values smaller than those used in the Rose's condition of Eq. (7) are used. What is common with the Rose's condition of Eq. (7) is that the value of g(B2) is set negative.

As can be seen by comparing the examples of FIGS. 5(a) and 5(b), in a case where a magnetic quadrupole field alone is produced so as not to produce astigmatism, the profile of the electron beam is stretched in the X-direction. Accordingly, the stigmatic focusing condition of Eq. (4) is achieved by applying the magnetic quadrupole field in the reverse direction to rather increase astigmatism and applying an excessive amount of electric quadrupole field.

That is, where g(B2) is set negative, the profile of the electron beam is stretched in the Y-direction. When g(B2)=−4 is reached, this stretching effect no longer holds. Accordingly, the condition of Eq. (6) is derived because the profile portions 21 and 22 of the electron beam focused onto the slit 13 are stretched in the Y-direction. Furthermore, the condition of Eq. (6) and the stigmatic focusing condition of Eq. (4) are added. In this way, the condition of Eq. (5) is derived.

As described so far, the energy filter 10 according to the present embodiment has a structure that is symmetrical with respect to the slit 13. Also, the orbit of the electron beam is symmetrical with respect to the slit 13. Consequently, aberration is suppressed. Furthermore, the profile portions 21 and 22 of the electron beam focused onto the slit 13 are stretched in the Y-direction perpendicular to the direction of dispersion, by producing electric and magnetic quadrupole fields so as to satisfy the conditions of Eqs. (5) and (6). Hence, high energy resolution is accomplished.

Figure 7A:
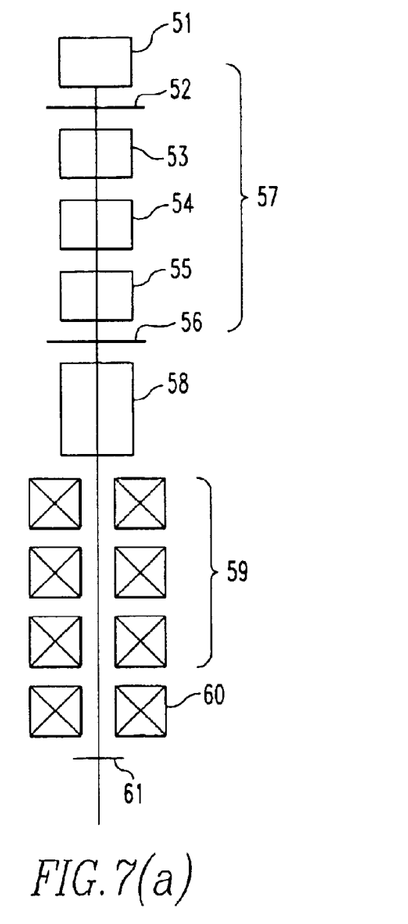
FIGS. 7(a) and 7(b) are diagrams showing the configuration of an electron microscope having a built-in energy filter.
Figure 7B:
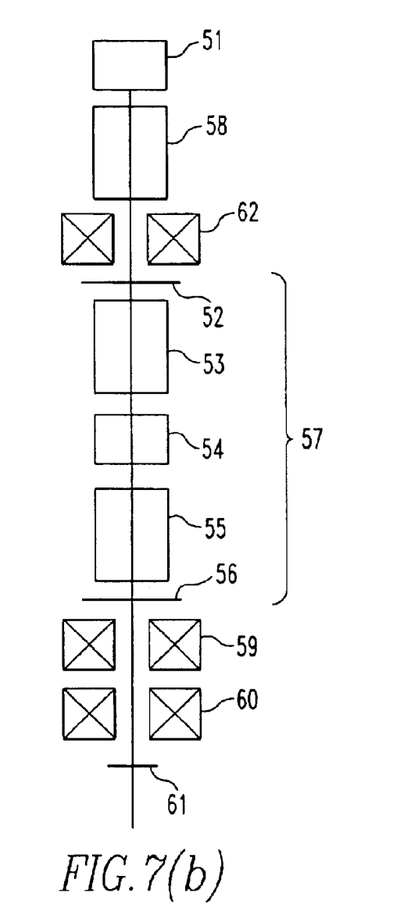

FIGS. 7(a) and 7(b) show the structures of electron microscopes each incorporating the energy filter 10. FIG. 7(a) shows an example in which the energy filter is arranged between a field emission gun (FEG) and an acceleration tube.

An electron beam having a relatively low energy of about 1 to several keV emitted from the FEG 51 is made to enter a decelerating energy filter 57 consisting of an entrance aperture 52, a decelerating portion 53, an energy filter portion 54, an accelerating portion 55, and an exit aperture 56.

In this decelerating energy filter 57, incident electrons are decelerated to an energy of about hundreds of eV by the decelerating portion 53 and then only electrons having a given energy are selected by the filter portion 54. The electrons are again accelerated to have the original energy by the accelerating portion 55, and exit from the exit aperture 56. The energy filter portion 54 corresponds to the energy filter 10 shown in FIG. 1.

The electron beam exiting from the exit aperture 56 is accelerated to a desired high energy (e.g., about 200 keV) by an acceleration tube 58 and then made to hit a specimen 61 via a system of condenser lenses 59 and an objective lens 60.

FIG. 7(b) shows an embodiment in which the energy filter according to the present invention is positioned behind an acceleration tube. In this embodiment, an electron beam having a relatively low energy of about 1 to several keV emitted from an FEG 51 is accelerated to a desired high energy (e.g., about 200 keV) by an acceleration tube 58 and then made to enter a decelerating energy filter 57 via a condenser lens 62. This decelerating energy filter 57 consists of an entrance aperture 52, a decelerating portion 53, an energy filter portion 54, an accelerating portion 55, and an exit aperture 56.

In this decelerating energy filter 57, incident electrons are decelerated to an energy of about several hundreds of eV by the decelerating portion 53. Then, only electrons having a given energy are selected by the energy filter portion 54 and then reaccelerated to the original energy by the accelerating portion 55. The electrons exit from the exit aperture 57. The energy filter portion 54 corresponds to the energy filter 10 shown in FIG. 1.

The electron beam going out of the exit aperture 56 is made to hit a specimen 61 via a system of condenser lenses 59 and an objective lens 60.

The decelerating portion 53 and accelerating portion 55 of the decelerating energy filter 57 need to decelerate the high-energy electrons to an energy of about hundreds of eV and to accelerate the electrons to the original high energy. Therefore, the decelerating portion 53 and accelerating portion 55 are preferably of multistage configuration in the same way as the original acceleration tube 58.

In the above-described electron microscope, the electron beam emitted from the FEG 51 passes through the acceleration tube and is accelerated to a high energy. During this process, the beam passes through a monochromator. In spite of this passage, the beam is focused only once in the X-direction in the position of the slit. Since the number of times that the beam is focused is few, energy spread and beam diameter increase due to Coulomb interactions and can be more suppressed than energy filters of similar other types.

Furthermore, the energy filter 10 with smaller aberration is used as a monochromator. This permits the beam passed through the filter to be directed at the specimen such that the small beam diameter is maintained.

It is to be understood that the embodiments described above illustrate specific embodiments of the invention and that the invention is not limited thereto. It would be obvious to those skilled in the art that the embodiments may be modified without departing from the scope of the invention.

The present invention can provide an energy filter with less aberration and an electron microscope fitted with such an energy filter.

Having thus described our invention with the detail and particularity required by the Patent Laws, what is desired protected by Letters Patent is set forth in the following claims:

The invention claimed is:

1. An energy filter having a first filter, and a second filter disposed behind the first filter and a slit disposed between said first filter and said second filter, said first filter using a combination of electric and magnetic fields to select charged particles having a certain energy, wherein said first filter is so controlled that a beam of charged particles having a cross-sectional shape extending in a direction substantially perpendicular to a direction in which the charged particles are dispersed in said first filter is formed on said slit by aberration created by said first filter, said beam of charged particles being focused in both X and Y directions at the position of said slit by said first filter, and wherein said second filter is so controlled that aberration created by said first filter is reduced.

2. The energy filter set forth in claim 1, wherein said first and second filters are substantially identical in length taken in the direction of the optical axis of said beam of charged particles.

3. The energy filter set forth in claim 1 or 2, wherein each of said first and second filters is a Wien filter.

4. The energy filter set forth in claim 3, wherein each of said first and second filters has 12 poles symmetrical with respect to said optical axis.

5. The energy filter set forth in claim 1, wherein a slit is disposed in a position at which said charged particles are focused by said first filter along said optical axis.

6. The energy filter set forth in claim 1, wherein said first and second filters achieve astigmatic focusing by satisfying the following equation:

$$f(E2)+g(B2)=1$$

where the functions f(E2) and g(B2) are defined by the following equations:

$$f(E2)=-4R\ E2/E1$$

$$g(B2)=4R\ B2/B1$$

where E1 and B1 are electric and magnetic dipole fields, respectively, satisfying the Wien condition, E2 and B2 are electric and magnetic quadrupole fields, respectively, satisfying the Wien condition, and R is a cyclotron radius.

7. The energy filter set forth in claim 6, wherein said electric quandrupole field E2 and magnetic quadrupole field B2 satisfy the following numerical formulas:

$$1<f(E2)<4$$

$$-3<g(B2)<0$$

8. The energy filter set forth in claim 1, wherein said charged particles pass through a range in a plane perpendicular to said optical axis in the position at which the charged particles are focused by said first filter, and wherein the dimension of said range taken in a direction perpendicular to the direction of dispersion in said first filter is more than twice as long as the dimension of said range taken in said direction of dispersion.

9. An electron microscope having an energy filter set forth in claim 1 or 2, wherein said energy filter is disposed between a source for producing said charged particles and a specimen to be observed.

10. The energy filter set forth in claim 1, wherein said first and second filters have electric and magnetic quadrupole fields, respectively, along said optical axis, and wherein said electric and magnetic quadrupole fields make an angle of 45 degrees to said optical axis.

* * * * *

UNITED STATES PATENT AND TRADEMARK OFFICE
CERTIFICATE OF CORRECTION

PATENT NO. : 6,960,763 B2
DATED : November 1, 2005
INVENTOR(S) : Lopez et al.

It is certified that error appears in the above-identified patent and that said Letters Patent is hereby corrected as shown below:

<u>Column 10,</u>
Line 5, "achieve astigmatic focusing" should read -- achieve stigmatic focusing --.

Signed and Sealed this

Twenty-fifth Day of April, 2006

JON W. DUDAS
*Director of the United States Patent and Trademark Office*